United States Patent [19]

Raets

[11] Patent Number: 4,695,770
[45] Date of Patent: Sep. 22, 1987

[54] CIRCUIT FOR SWITCHING CURRENT IN AN INDUCTIVE LOAD

[75] Inventor: Hubert C. Raets, Nieuwenhagen, Netherlands

[73] Assignee: U.S. Philips Corporation, New York, N.Y.

[21] Appl. No.: 709,014

[22] Filed: Mar. 7, 1985

[30] Foreign Application Priority Data

Mar. 15, 1984 [DE] Fed. Rep. of Germany ....... 3409423

[51] Int. Cl.⁴ ........................................... H05B 37/00
[52] U.S. Cl. .................................... 315/207; 315/219; 315/242; 307/566
[58] Field of Search ................ 307/565, 566, 270; 315/219, 224, 208, 206, 243, 242

[56] References Cited

U.S. PATENT DOCUMENTS

| | | | |
|---|---|---|---|
| 3,249,808 | 5/1966 | Short | 315/206 |
| 3,641,407 | 2/1972 | Scott | 307/566 |
| 3,936,721 | 2/1976 | Butterworth | 315/224 |
| 4,005,335 | 1/1977 | Perper | 315/224 |
| 4,096,400 | 6/1978 | Ferry et al. | 307/270 |
| 4,360,744 | 11/1982 | Taylor | 307/270 |
| 4,385,262 | 5/1983 | Cambier | 315/207 |
| 4,441,053 | 4/1984 | Daspit | 315/207 |
| 4,547,686 | 10/1985 | Chen | 307/566 |

Primary Examiner—Harold Dixon
Attorney, Agent, or Firm—Robert T. Mayer; Bernard Franzblau

[57] ABSTRACT

A circuit for switching a current in an inductive load comprising at least one transistor (1) which switches through its collector-emitter path the current in the load (7). The base is coupled to the emitter through a voltage-stabilizing element (5) for stabilizing the voltage supplied to the base. A dissipation device is usually added to the circuit for dissipating currents or voltages occurring in a sense opposite to the sense of conduction of the transistor (1). A simplification of the circuit and hence a decrease in the cost thereof is achieved in that the voltage-stabilizing element (5) also serves as the dissipation device.

22 Claims, 3 Drawing Figures

CIRCUIT FOR SWITCHING CURRENT IN AN INDUCTIVE LOAD

BACKGROUND OF THE INVENTION

This invention relates to a circuit arrangement for switching a current in a load which includes an inductive reactance, comprising at least one transistor which switches through its collector-emitter path the current in the load and whose base is connected to the emitter through a voltage-stabilizing element for stabilizing the value of a voltage supplied to the base, as well as a dissipation device for dissipating currents or voltages occurring in a sense opposite to the sense of conduction of the transistor and produced by the inductive reactance.

From the "International Rectifier HEXFET Data Book" HDB-2, Chapter 12, Application Note 946, p. A-111 to A-122, especially FIG. 11, of 1982, such a circuit arrangement is known and comprises an electronic switch (e.g. a bipolar transistor) by means of which the current is switched in a load which comprises a series arrangement of an inductor and a capacitor. The current in the load then flows through the collector-emitter path of the bipolar transistor, having a base supplied with a switching voltage which is produced in a driver circuit. In order to stabilize the value of this switching voltage in the cutoff condition of the bipolar transistor, the base is coupled via a Zener diode to the emitter of the bipolar transistor.

In the known circuit arrangement, the main current path of a field effect transistor is also included in the path of the current through the load, i.e. in series with the collector-emitter path of the bipolar transistor. The gate electrode of this field effect transistor is supplied by a control circuit with a control voltage for controlling the current in the load. The control circuit then supplies only the very small gate current of the field effect transistor. Thus, it becomes possible for the electronic switch to be directly driven by logic switching circuits.

When the current in an inductive load is switched off, voltage peaks or overshoot pulses are obtained because of the self-inductance. These overshoot pulses have a sense opposite to that of the current flowing through the electronic switch in the conducting condition or of the voltage applied thereto in its cut-off condition after switching transients have decayed. These voltage peaks may lead very rapidly to a destruction of the transistor. Therefore, they are dissipated through a dissipation device, preferably a fly-back diode, which is arranged parallel to the series arrangement of the collector-emitter path of the bipolar transistor and the main current path of the field effect transistor and with such a polarity that it remains cut off for the voltage applied in the cut-off condition of the transistor between its collector and its emitter after switching transients have decayed. In circuit arrangements for switching a high voltage at a load having a high inductive reactance, this diode must have on the one hand a high cut-off voltage and must be designed on the other hand for a high peak current. Such diodes are comparatively expensive.

SUMMARY OF THE INVENTION

The invention has for an object to simplify a circuit arrangement of the kind mentioned in the opening paragraph in a manner such that the use of a separate expensive dissipation device can be avoided without any reduction in the protection of the transistor from voltage peaks.

According to the invention, this object is achieved in that the voltage-stabilizing element serves at the same time as a dissipation device.

In the circuit arrangement according to the invention, the voltage-stabilizing element therefore has a dual function, i.e. it serves not only to stabilize the switching voltage at the base of the transistor, but also to dissipate voltage peaks or overshoot pulses, more particularly when the transistor is changed over to the cutoff condition. The currents flowing in a sense opposite to the sense of conduction of the transistor are dissipated only through the voltage-stabilizing element and the collector-base path of the transistor. The separate dissipation device, more particularly in the form of a fly-back diode, parallel to the collector-emitter path of the transistor may then be dispensed with. The voltage-stabilizing element in the circuit arrangement according to the invention has to be designed solely for the voltage or current or overshoot pulses. However, this is considerably simpler and less expensive than an additional dissipation device separate from the voltage-stabilizing element.

A particularly simple circuit arrangement according to a further embodiment of the invention is obtained in that the voltage-stabilizing element comprises a Zener diode. This Zener diode stabilizes, when polarized in the cut-off direction, the voltage at the base of the transistor and constitutes immediately upon polarization in the forward direction together with the collector-base path of the transistor a dissipation device for voltage peaks or overshoot pulses occurring in a sense opposite to the sense of conduction of the transistor. The Zener diode is designed so that it can conduct in the forward direction the maximum value of the currents which are produced by the voltage peaks or overshoot pulses.

For the sake of completeness, it should be noted here that it is known from "I.E.E.E. J. Solid-State Circuits". Vol. SC-16, No. 2, April 1981, p. 62 to 65, to arrange, parallel to the base-emitter path of a bipolar transitor which switches a current in an inductive load, more particularly an oscillatory circuit, a fly-back diode in a manner such that its cathode is connected to the base and its anode is connected to the emitter of the (npn) transistor. This fly-back diode constitutes a limiter during the negative half wave occurring at the inductive load after the transistor has been changed over to the cut-off condition. However, in this circuit arrangement, no voltage-stabilizing element is provided for stabilizing the voltage at the base of the transistor or at another point of the circuit arrangement.

BRIEF DESCRIPTION OF THE DRAWING

Two embodiments of the invention are shown in the drawing and are described more fully hereinafter. In the drawing.

DESCRIPTION OF THE PREFERRED EMBODIMENTS

Figure 1:
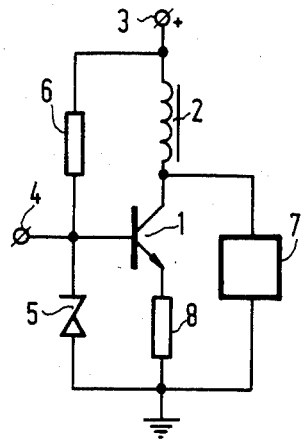
FIG. 1 shows a first embodiment of a circuit arrangement according to the invention in simplified form.

FIG. 1 shows schematically a circuit diagram of a simple embodiment of a circuit arrangement according to the invention. In this Figure, reference numeral 1 designates a bipolar transistor, having a collector connected through a supply coil 2 to the positive terminal 3 of a direct voltage source. The base of the transistor 1 is connected to an input connection 4 for supplying a switching signal by which the transistor is switched alternately to the conducting and to the cut-off condition. The input connection 4 is further connected to the cathode of a Zener diode 5 and to a first terminal of a series resistor 6. The Zener diode 5 constitutes a voltage-stabilizing element. Its anode is connected to ground, to which the emitter of the transistor 1 is also connected through an emitter resistor 8. Together with the series resistor 6, whose second terminal is connected to the positive terminal 3 of the direct voltage source, a maximum value of a direct bias voltage is developed at the input connection 4 and hence at the base of the transistor 1. The switching signal supplied through the input connection 4 is superimposed on this voltage.

The collector and the emitter of the transistor 1 are each connected to a terminal of a load 7, which comprises an inductive reactance. The load 7 may include an ohmic resistor along with an inductor. The load 7 may comprise a series capacitor which prevents a direct voltage from flowing from the positive terminal 3 of the direct voltage source via the supply coil 2 through the load 7 to ground.

Due to the energy stored by virtue of the currents flowing in the inductors of the supply coil 2 and of the load 7, voltage peaks or overshoot pulses may occur, by which a voltage negative with respect to ground is produced at the collector of the transistor 1. Such negative voltage peaks are advantageously dissipated in the present circuit arrangement, without the use of additional elements, through the Zener diode 5 and the base-collector path of the transistor 1. The Zener diode which, when polarized in its reverse direction, constitutes a voltage-stabilizing element, constitutes a diode when polarized in the forward direction, i.e. when current flows from ground and up through the zener diode to the base of the transistor. As a result, the elements of the circuit arrangement are prevented from being damaged.

An even simpler circuit arrangement is obtained if the load 7 in FIG. 1 is removed. The supply coil 2 then acts as a load impedance having an inductive reactance, through which can also be produced negative voltage peaks or overshoot pulses, which are dissipated through the Zener diode 5 and the collector-base path of the transistor 1.

Figure 2:
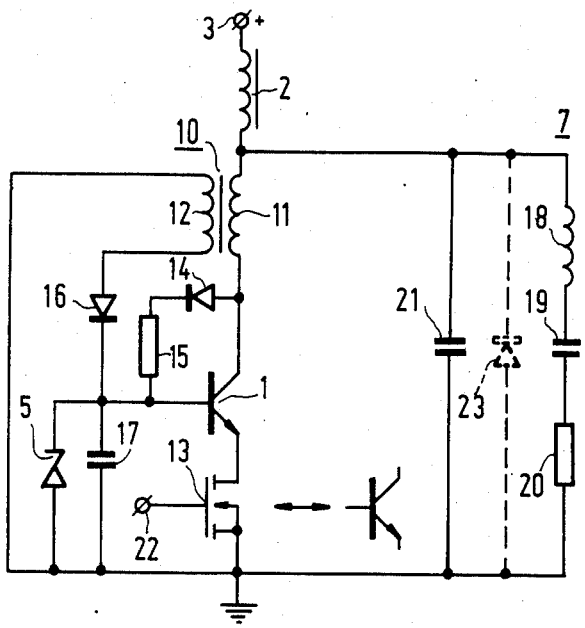
FIG. 2 shows a second embodiment of a circuit arrangement according to the invention.

FIG. 2 shows in slightly greater detail a circuit diagram of a further embodiment of the invention. In this circuit arrangement, the collector-emitter path of the bipolar transistor 1 is connected in series with a primary winding 11 of a transformer 10, with the supply coil 2 and with the main current path of a switching element 13. The switching element is preferably a field effect transistor whose main current path constitutes the source-drain path, but it also could be a second bipolar transistor whose main current path is the collector-emitter path. However, other kinds of switching elements may also be used, such as, for example, thyristors and the like.

The circuit arrangement shown in FIG. 2 has a further series arrangement of a first diode 14 and a resistor 15. The anode of the first diode 14 is connected to the collector of the bipolar transistor 1 and the cathode of the first diode 14 is connected through the resistor 15 to the base of the bipolar transistor 1. Furthermore, the anode of a second diode 16 is connected to a terminal of the secondary winding 12 of the transformer 10. The cathode of diode 16, a terminal of a capacitor 17 and the cathode of the Zener diode 5 are all connected to the base of the transistor 1. The second terminal of the capacitor 17 as well as the anode of the Zener diode 5 and the second terminal of the secondary winding 12 of the transformer 10 are all connected to ground.

In the present embodiment, the load 7 comprises a series arrangement of a load inductor 18, a load capacitor 19 and a load resistor 20. This series arrangement is connected parallel to a parallel capacitor 21. A terminal of this parallel arrangement is connected to the junction of the primary winding 11 of the transformer 10 and the supply coil 2, while a second terminal of the parallel arrangement is connected to ground together with the end of the main current path of the switching element 13 remote from the bipolar transistor 1. The connection of the supply coil 2 remote from the transformer 10 is again connected to the positive terminal 3 of the direct voltage source.

If the bipolar transistor 1 is in the cut-off condition, on the one hand a current from the positive terminal 3 of the direct voltage source flows through the supply coil 2 into the load 7. On the other hand, a generally much smaller current flows from the terminal 3 through the primary winding 11 of the transformer 10, the first diode 14 and the resistor 15 to the capacitor 17 and charges this capacitor to the maximum bias voltage for the base of the bipolar transistor 1, which is set by the Zener diode 5. The switching element 13, for example a field effect transistor, is also cut off.

For changing over the bipolar transistor 1, a control signal is supplied to the switching element 13 through a control connection 22, which in the present case is connected to he gate electrode of the field effect transistor. The field effect transistor 13 becomes conductive so that the potential at the emitter of the bipolar transistor 1 is reduced with respect to the bias voltage at the base (defined by the Zener diode 5) to such an extent that the bipolar transistor 1 is changed over to the conducting condition. The capacitor 17 is then discharged very rapidly via the base-emitter path of the bipolar transistor 1 and accelerates the switching process. Due to the rise of the current in the collector-emitter path of the bipolar transistor 1, there is moreover produced in the secondary winding 12 of the transformer 10 a voltage by which a further current is supplied through the second diode 16 to the capacitor 17 and hence to the base, which current ensures that the conducting condition of the bipolar transistor 1 is maintained.

The current through the collector-emitter path of the bipolar transistor 1 and the supply coil 2 rises continuously until the field effect transistor 13 is switched to the cut-off condition by a control signal at the control terminal 22. The further current that flows because of the self-inductance of the supply coil 2 then flows through the load 7, to which consequently the energy is supplied which was stored thus far in the supply coil 2. At the same time the capacitor 17 starts again the process of being charged through the primary winding 11 and the first diode 14 as well as the resistor 15.

The load 7 in the present circuit arrangement constitutes an oscillatory circuit which is excited to oscillate by the supply of the energy from the supply coil 2. The terminal of the load connected to the transformer 10 and the supply coil 2 can assume a negative voltage with respect to ground. According to the invention, in the present embodiment of the circuit arrangement, these negative voltage peaks or overshoot pulses are dissipated via the Zener diode 5 and the base-collector path of the bipolar transistor 1 (and the primary winding 11 of the transformer 10). For comparison a fly-back diode 23 is shown, in broken lines, which was required for dissipating the voltage peaks or overshoot pulses in the circuit arrangements known hitherto and which is economized in the circuit arrangement according to the invention.

Figure 3:
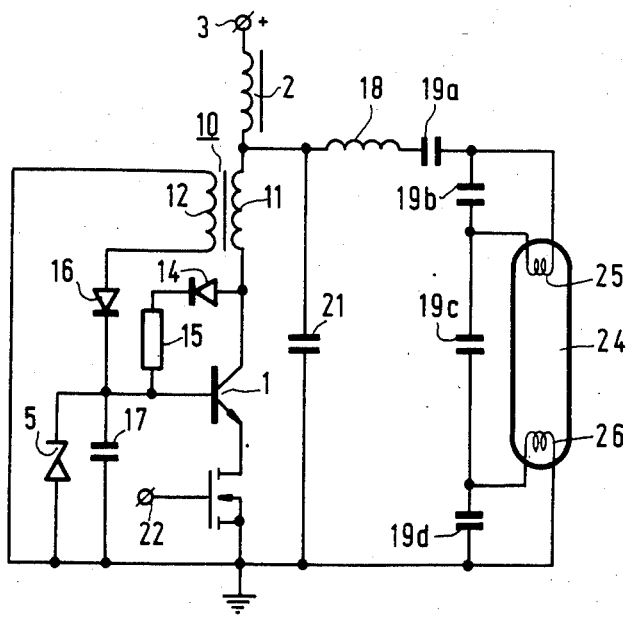
FIG. 3 shows a circuit arrangement according to the invention in which the load is a discharge lamp.

In FIG. 3, the same reference numerals are used for parts corresponding to those in FIG. 2. As a load, a tubular low-pressure mercury vapour discharge lamp 24 (having in a practical embodiment a power of about 15 W) is used. At the ends of the lamp are arranged the electrodes 25 and 26, between which during operation a discharge is maintained. The circuit arrangement acts as a DC/AC converter for the lamp. In order to prevent the lamp from igniting with cold cathodes, a series arrangement of capacitors 19a, 19b, 19c and 19d are included in addition of the inductor 18. The electrodes 25 and 26 of the lamp are parallel-connected across the capacitor 19b and the capacitor 19d, respectively.

In a practical embodiment, the circuit elements shown in FIG. 3 have the values indicated in the Table below

TABLE

| | |
|---|---|
| resistor 15 | 1 MΩ |
| capacitor 17 | 2.7 nF |
| capacitor 21 | 290 pF |
| capacitor 19a | 495 pF |
| capacitor 19b | 15 nF |
| capacitor 19c | 804 pF |
| capacitor 19d | 15 nF |
| inductor 2 | 6.6 mH |
| inductor 18 | 0.52 mH |

The frequency of this circuit arrangement during operation of the lamp is about 400 kHz.

What is claimed is:

1. A circuit arrangement for switching a current in a load which includes an inductive reactance, comprising, at least one transistor which switches through its collector-emitter path the current in the load, means connecting the transistor base to its emitter through a voltage-stabilizing element for stabilizing a voltage supplied to the base, said voltage-stabilizing element also being operative as a dissipation device for dissipating currents or voltages occurring in a sense opposite to the sense of conduction of the transistor and produced by th inductive reactance.

2. A circuit arrangement as claimed in claim 1, wherein the voltage-stabilizing element comprises a Zener diode, said circuit further comprising, a pair of terminals for coupling a DC operating voltage to said transistor and to said load, and a DC circuit connecting the Zener diode to said pair of terminals so as to derive a maximum value of direct bias voltage at the base of the transistor.

3. A circuit arrangement as claimed in claim 2 wherein the load includes a discharge lamp.

4. A circuit arrangement as claimed in claim 1 wherein the load includes a discharge lamp.

5. A circuit as claimed in claim 1 wherein said currents or voltages produced by the load inductive reactance occur in the cut-off condition of said transistor and said voltage-stabilizing element and the base-collector junction of the transistor provide a low impedance series circuit for dissipating said currents or voltages.

6. A circuit for switching current in a load which includes an inductive reactance comprising: switching means including a switching transistor, a transformer having a primary winding and a secondary winding, means coupling the transistor and the primary winding in series to terminals for a D.C. voltage source, second means coupling the load to the transistor so that switching of the transistor switches the current in the load, a voltage-stabilizing element connected between base and emitter of the transistor so as to stabilize the base voltage of the transistor, said voltage-stabilizing element also providing, after the transistor is switched off, a low impedance path that includes the base-collector junction of the transistor thereby to dissipate energy developed in the load inductive reactance of a polarity to produce a current flow in a direction opposite to the sense of conduction of the transistor, third means coupling the transformer secondary winding to the base of the transistor, and means for switching the transistor on and off.

7. A circuit as claimed in claim 6 wherein the second coupling means connects the lead in parallel with the series connection of the transistor and the primary winding and the switching means comprises: a second transistor connected in series with the switching transistor in the emitter circuit thereof, and a terminal for applying a switching voltage to a control electrode of the second transistor.

8. A circuit as claimed in claim 6 wherein the first coupling means comprises an inductor connected in series with the transformer primary winding to one terminal for the D.C. voltage source.

9. A circuit as claimed in claim 6 further comprising a first diode and a resistor connected in a series circuit with the transformer primary winding and the voltage-stabilizing element to the terminals for the D.C. voltage source.

10. A circuit as claimed in claim 9 wherein the third coupling means comprises a second diode connected between the transformer secondary winding and the base of the switching transistor, the circuit further comprising a capacitor connected in parallel with the voltage-stabilizing element.

11. A circuit as claimed in claim 6 further comprising a first diode and a resistor connected in a series circuit with the voltage-stabilizing element to the terminals for the D.C. voltage source, said series circuit including the transformer primary winding but excluding the collector-emitter path of the switching transistor.

12. A circuit as claimed in claim 6 wherein the load includes an inductor, a capacitor and an electric discharge lamp connected in series across the series combination of the transistor and the transformer primary winding, said circuit further comprising a first diode and a resistor connected in a series circuit across the transistor, a capacitor connected in parallel with the voltage-stabilizing element, and wherein the third coupling means comprises a second diode connected between the transformer secondary winding and the base of the switching transistor.

13. A circuit as claimed in claim 12, wherein the first coupling means comprises an inductor connected in series with the transformer primary winding to one terminal for the D.C. voltage source, and the switching means comprises a field effect transistor connected in series with the switching transistor in the emitter circuit thereof and a terminal for applying a switching voltage to a control electrode of the field effect transistor.

14. A circuit as claimed in claim 6 wherein the third coupling means includes a diode directly connected between the transformer secondary winding and the base of the switching transistor and polarized to supply a base current that flows in the forward direction of the base-emitter junction of the switching transistor.

15. A circuit as claimed in claim 6 wherein the voltage-stabilizing element comprises a Zener diode connected so as to be polarized in the forward direction by said energy developed in the load inductive reactance.

16. A circuit for switching current in a load which includes an inductive reactance comprising: a switching transistor, an inductor, means connecting the inductor and the switching transistor in a series circuit across the terminals of a D.C. voltage source, means connecting the load in parallel with at least a portion of the series circuit that includes the switching transistor whereby the switching transistor switches current in the load, a voltage-stabilizing element connected between base and emitter of the transistor so as to stabilize the base voltage of the transistor in the cut-off condition thereof, said voltage-stabilizing element also providing, in the cut-off condition of the transistor, a low impedance path that includes the base-collector junction of the transistor thereby to dissipate currents or voltages in the load that occur in a sense opposite to the sense of conduction of the transistor and produced by the load inductive reactance.

17. A circuit as claimed in claim 16 wherein the voltage-stabilizing element comprises a Zener diode polarized in the forward direction for said currents or voltages in the load that are to be dissipated.

18. A circuit as claimed in claim 16 wherein the transistor is an NPN transistor and the voltage-stabilizing element comprises a Zener diode having a cathode and an anode connected to the base and emitter, respectively, of the transistor.

19. A circuit as claimed in claim 16 wherein the load includes a capacitor and a second inductor connected in a second series circuit between a junction point of the first inductor and the transistor and a terminal of the D.C. voltage source remote from said junction point, and a second capacitor connected in parallel with the second series circuit, said load forming a resonant circuit excited into oscillation by energy supplied thereto from the first inductor.

20. A circuit as claimed in claim 16 wherein the load is connected in parallel with a portion of said series circuit that includes the transistor but not the inductor, said circuit further comprising a second transistor connected in series with the switching transistor in the emitter circuit thereof, and a terminal for applying a switching voltage to a control electrode of the second transistor.

21. A circuit as claimed in claim 16 wherein the voltage-stabilizing element comprises a Zener diode, said circuit further comprising, a capacitor coupled in parallel with the Zener diode and a unidirectional current path coupling the Zener diode to the terminals of the D.C. voltage source.

22. A circuit as claimed in claim 1 wherein the voltage stabilizing element comprises a Zener diode.

* * * * *